United States Patent
Jung et al.

(10) Patent No.: US 11,601,131 B2
(45) Date of Patent: Mar. 7, 2023

(54) PHASE LOCKED LOOP AND OPERATING METHOD OF PHASE LOCKED LOOP

(71) Applicant: SAMSUNG ELECTRONICS CO., LTD., Suwon-si (KR)

(72) Inventors: Sangdon Jung, Yongin-si (KR); Gyusik Kim, Suwon-si (KR); Seungjin Kim, Yongin-si (KR); Seunghyun Oh, Seoul (KR); Jihwan Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/734,693

(22) Filed: May 2, 2022

(65) Prior Publication Data

US 2022/0360270 A1 Nov. 10, 2022

(30) Foreign Application Priority Data

May 10, 2021 (KR) .................. 10-2021-0060302

(51) Int. Cl.
*H03L 7/10* (2006.01)
*H03L 7/099* (2006.01)
*H03L 7/089* (2006.01)

(52) U.S. Cl.
CPC ............ *H03L 7/102* (2013.01); *H03L 7/0891* (2013.01); *H03L 7/099* (2013.01)

(58) Field of Classification Search
CPC ........ H03L 7/102; H03L 7/0891; H03L 7/099
See application file for complete search history.

(56) References Cited

U.S. PATENT DOCUMENTS

| 5,371,425 A | * | 12/1994 | Rogers | ................. H03L 7/0891 331/10 |
| 5,757,239 A | | 5/1998 | Gilmore | |
| 5,978,425 A | * | 11/1999 | Takla | .................... H03L 7/0891 331/10 |

(Continued)

FOREIGN PATENT DOCUMENTS

| EP | 815648 B1 | 6/2002 |
| EP | 2590263 B1 | 9/2018 |
| KR | 100495304 B1 * | 6/2005 |

*Primary Examiner* — Adam D Houston
(74) *Attorney, Agent, or Firm* — Volentine, Whitt & Francos, PLLC

(57) ABSTRACT

A phase locked loop includes a phase detector outputting a first signal corresponding to a phase difference of a reference frequency signal and a division frequency signal, a charge pump amplifying a first signal to output a second signal, a loop filter filtering the second signal to output a third signal, a voltage-to-current converter receiving the third signal and outputting a fourth signal, a digital-to-analog converter outputting a fifth signal based on the fourth signal and a digital compensation signal, an oscillator outputting an output frequency signal having a frequency corresponding to the fifth signal, a divider dividing the frequency of the output frequency signal to output the division frequency signal and a compensation frequency signal, and an automatic frequency calibrator compensating for the voltage-to-current converter based on a difference between a frequency of the compensation frequency signal and a frequency of a reference frequency signal.

20 Claims, 11 Drawing Sheets

(56) References Cited

U.S. PATENT DOCUMENTS

| | | | |
|---|---|---|---|
| 6,326,855 B1* | 12/2001 | Jelinek | H03L 1/00 331/34 |
| 7,145,399 B2 | 12/2006 | Staszewski et al. | |
| 7,474,130 B1* | 1/2009 | Lo | H03L 1/022 327/143 |
| 7,616,069 B2 | 11/2009 | Li | |
| 7,692,500 B1* | 4/2010 | Koukab | H04L 27/12 332/127 |
| 8,010,072 B1* | 8/2011 | Nathawad | H03L 7/1072 331/25 |
| 8,089,324 B2 | 1/2012 | Tarng | |
| 8,432,204 B1* | 4/2013 | Chern | H03L 7/104 327/148 |
| 8,705,663 B2 | 4/2014 | Xu | |
| 8,901,994 B2 | 12/2014 | Fan | |
| 9,024,667 B1* | 5/2015 | Fu | H03L 1/00 327/148 |
| 9,077,351 B2* | 7/2015 | Park | H03L 7/085 |
| 9,654,121 B1* | 5/2017 | Chu | H03L 7/099 |
| 9,705,512 B1* | 7/2017 | Kuan | H03L 7/0898 |
| 10,483,991 B2* | 11/2019 | Yagi | H03L 7/0895 |
| 10,972,109 B2* | 4/2021 | Kundu | H03L 7/113 |
| 11,277,143 B1* | 3/2022 | Kundu | H03L 7/093 |
| 2002/0190765 A1* | 12/2002 | Matsunami | H03L 7/0995 327/156 |
| 2004/0051591 A1* | 3/2004 | Okada | H03L 7/099 331/16 |
| 2007/0296511 A1* | 12/2007 | Holuigue | H03L 7/104 331/16 |
| 2008/0048788 A1* | 2/2008 | Yu | H03L 7/099 331/16 |
| 2010/0271138 A1* | 10/2010 | Thakur | H03L 7/102 331/17 |
| 2011/0298507 A1* | 12/2011 | Jakobsson | H03L 7/087 327/156 |
| 2011/0309867 A1* | 12/2011 | Choi | H03L 7/14 327/156 |
| 2012/0235718 A1* | 9/2012 | Thakur | H03L 7/0891 327/157 |
| 2013/0113535 A1 | 5/2013 | Haralabidis | |
| 2014/0184343 A1* | 7/2014 | Li | H03L 1/00 331/17 |
| 2015/0130522 A1* | 5/2015 | Li | H03L 7/06 331/8 |
| 2015/0145567 A1* | 5/2015 | Perrott | H03M 1/0854 327/156 |
| 2015/0349788 A1* | 12/2015 | Namdar-Mehdiabadi | H03L 7/0898 327/156 |
| 2020/0221046 A1* | 7/2020 | Kim | H03L 7/0891 |
| 2020/0401178 A1* | 12/2020 | Jung | H03L 7/097 |
| 2021/0083782 A1* | 3/2021 | Jones | H03L 7/0891 |

* cited by examiner

PHASE LOCKED LOOP AND OPERATING METHOD OF PHASE LOCKED LOOP

CROSS-REFERENCE TO RELATED APPLICATIONS

This U.S. non-provisional patent application claims priority under 35 U.S.C. § 119 to Korean Patent Application No. 10-2021-0060302, filed on May 10, 2021 in the Korean Intellectual Property Office, the disclosure of which is incorporated by reference herein in its entireties.

BACKGROUND

1. Technical Field

Embodiments of the present disclosure relate to an electronic device, and more particularly, relate to a phase locked loop that is quickly locked to a target frequency and an operating method of the phase locked loop.

2. Description of the Related Art

A phase locked loop may receive a reference frequency signal and may generate an output signal having various frequencies higher than the reference frequency signal by using the reference frequency signal. Electronic devices are designed to operate based on a clock signal having a specific frequency. Accordingly, the phase locked loop refers to a device that is necessarily used in the electronic devices.

A time is taken to lock a frequency of an output frequency signal, which the phase locked loop outputs, to a target frequency. An electronic device fails to operate normally until the frequency of the output frequency signal of the phase locked loop is locked to the target frequency. Accordingly, as a speed at which the phase locked loops are locked increases, a speed at which the electronic devices operate may become faster.

SUMMARY

Embodiments of the present disclosure provide a phase locked loop with an improved locking speed, and an operating method of the phase locked loop.

According to an embodiment, a phase locked loop includes a phase detector, a charge pump, a loop filter, a voltage-to-current converter, a digital-to-analog converter, an oscillator, a divider, and an automatic frequency calibrator. The phase detector receives a reference frequency signal and a division frequency signal and outputs a first signal corresponding to a phase difference of the reference frequency signal and the division frequency signal. The charge pump receives the first signal and amplifies the first signal to output a second signal. The loop filter receives the second signal and filters the second signal to output a third signal. The voltage-to-current converter receives the third signal and converts and outputs the third signal into a fourth signal. The digital-to-analog converter receives the fourth signal and a digital compensation signal and outputs a fifth signal based on the fourth signal and the digital compensation signal. The oscillator receives the fifth signal and outputs an output frequency signal having a frequency corresponding to the fifth signal. The divider receives the output frequency signal and divides the frequency of the output frequency signal to output the division frequency signal and a compensation frequency signal. The automatic frequency calibrator receives the compensation frequency signal and the reference frequency signal and compensates for the voltage-to-current converter based on a difference between a frequency of the compensation frequency signal and a frequency of the reference frequency signal.

According to another embodiment, a phase locked loop includes a phase detector, a charge pump, a loop filter, a voltage-to-current converter, a digital-to-analog converter, an oscillator, a divider, an automatic frequency calibrator, an adder, and a reset circuit. The phase detector receives a reference frequency signal and a division frequency signal and outputs a first signal corresponding to a phase difference of the reference frequency signal and the division frequency signal. The charge pump receives the first signal and amplifies the first signal to output a second signal. The loop filter receives the second signal and filters the second signal to output a third signal. The voltage-to-current converter receives the third signal and converts and outputs the third signal into a fourth signal. The digital-to-analog converter receives the fourth signal and a digital compensation signal and outputs a fifth signal based on the fourth signal and the digital compensation signal. The oscillator receives the fifth signal and outputs an output frequency signal having a frequency corresponding to the fifth signal. The divider receives the output frequency signal, receives a first digital input signal from an external device, and divides a frequency of the output frequency signal to a frequency of the division frequency signal at a division ratio defined by the first digital input signal to thus output the division frequency signal and a compensation frequency signal. The automatic frequency calibrator receives the compensation frequency signal and the reference frequency signal and compensates for the voltage-to-current converter based on a difference between a frequency of the compensation frequency signal and a frequency of the reference frequency signal. The adder receives a second digital input signal from the external device, receives a digital gain control signal from the automatic frequency calibrator, and outputs, as the digital compensation signal, a sum of the first digital input signal and the digital gain control signal. The reset circuit resets the divider and the phase detector in response to which a settling operation is performed in which the division ratio is adjusted by the first digital input signal and the frequency of the output frequency signal is adjusted by the second digital input signal.

According to another embodiment, an a phase locked loop includes a phase detector, a charge pump, a loop filter, a voltage-to-current converter, a digital-to-analog converter, an oscillator, and a divider. An operating method of the phase locked loop includes turning on all converting transistors of the digital-to-analog converter, and dividing, at the divider, a frequency of an output frequency signal of the oscillator to generate a compensation frequency signal. The operating method of the phase locked loop also includes comparing a frequency of a reference frequency signal and a frequency of the compensation frequency signal, and calibrating an amount of output current of the voltage-to-current converter, depending on a result of the comparing.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure are described in detail and clearly to such an extent that one of ordinary skill in the relevant art(s) may easily implement the present disclosure.

Figure 1:
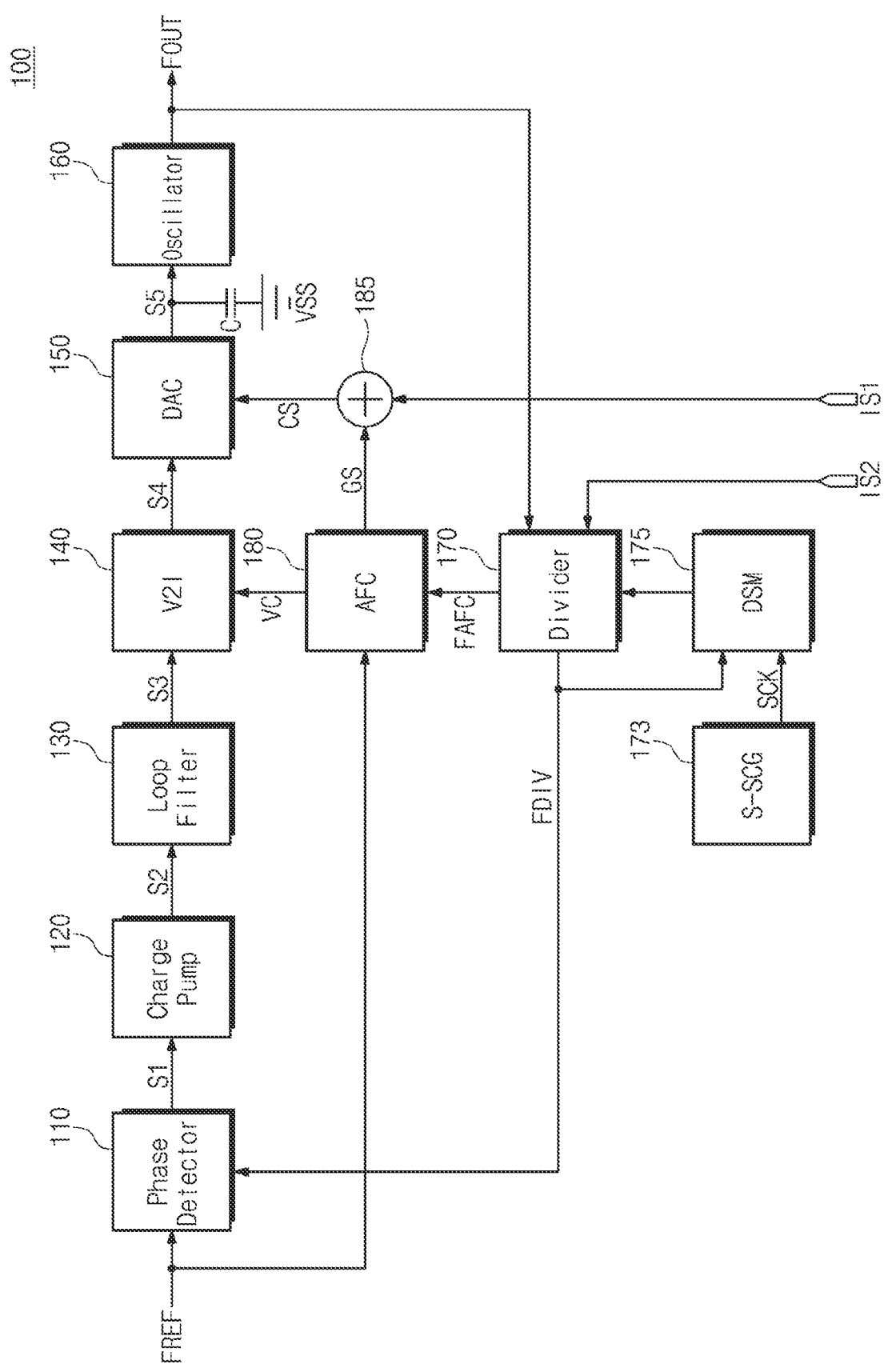
FIG. 1 illustrates a phase locked loop according to some embodiments of the present disclosure.

FIG. 1 illustrates a phase locked loop 100 according to some embodiments of the present disclosure. Referring to FIG. 1, the phase locked loop 100 may include a capacitor "C", a phase detector 110, a charge pump 120, a loop filter 130, a voltage-to-current converter 140 (V2I), a digital-to-analog converter 150 (DAC), an oscillator 160, a divider 170, a spread-spectrum clock generator 173 (S-SCG), a delta-sigma modulator 175 (DSM), an automatic frequency calibrator 180 (AFC), and an adder 185.

The phase detector 110 may receive a reference frequency signal FREF and a division frequency signal FDIV. The phase detector 110 may compare a phase of the reference frequency signal FREF and a phase of the division frequency signal FDIV and may output a first signal S1 corresponding to a comparison result. The first signal S1 may be in the form of a voltage.

In an embodiment, a difference between a frequency of the reference frequency signal FREF and a frequency of the division frequency signal FDIV may cause a difference between the phase of the reference frequency signal FREF and the phase of the division frequency signal FDIV. That is, the phase detector 110 may be regarded as comparing a difference between the frequency of the reference frequency signal FREF and the frequency of the division frequency signal FDIV, and the difference between the frequencies may be detected based on the comparison result from comparing the phases.

When the frequency of the reference frequency signal FREF and the frequency of the division frequency signal FDIV coincide with each other and the phase of the reference frequency signal FREF and the phase of the division frequency signal FDIV coincide with each other, the phase detector 110 may output the first signal S1 indicating that there is no difference.

The charge pump 120 may receive the first signal S1 from the phase detector 110. The charge pump 120 may amplify a level (e.g., a voltage level) of the first signal S1 to output a second signal S2. The second signal S2 may be in the form of a voltage.

The loop filter 130 may filter the second signal S2 so as to output a third signal S3. For example, the loop filter 130 may be a low pass filter that removes a high-frequency component from the second signal S2. The loop filter 130 may suppress sudden fluctuations in the second signal S2 so as to output the third signal S3.

The voltage-to-current converter 140 outputs a fourth signal S4. The voltage-to-current converter 140 may convert the third signal S3 in the form of a voltage level into the fourth signal S4 in the form of a current amount. The voltage-to-current converter 140 may receive a variation control signal VC from the automatic frequency calibrator 180. Based on the variation control signal VC, the voltage-to-current converter 140 may calibrate variables such as process, voltage, and temperature (PVT) variations of the phase locked loop 100.

The digital-to-analog converter 150 may receive the fourth signal S4 from the voltage-to-current converter 140 and may receive a digital compensation signal CS from the adder 185. Variations such as PVT variations of the digital-to-analog converter 150 may be calibrated based on the fourth signal S4. The digital-to-analog converter 150 may convert the digital compensation signal CS into a fifth signal S5. The fifth signal S5 may be in the form of a current amount. The digital-to-analog converter 150 may output a current, the amount of which corresponds to a value of the digital compensation signal CS, as the fifth signal S5. The fifth signal S5 reflects calibration of the digital-to-analog converter 150 based on the fourth signal S4.

The capacitor "C" may be connected with an output terminal of the digital-to-analog converter 150. The capacitor "C" may remove a high-frequency component from the fifth signal S5. In an embodiment, the capacitor "C" may be omitted.

The oscillator 160 may generate an output frequency signal FOUT based on the fifth signal S5. A frequency of the output frequency signal FOUT may correspond to a magnitude of the fifth signal S5, for example, the amount of a current. For example, the oscillator 160 may be a current controlled oscillator (CCO).

The divider 170 may receive the output frequency signal FOUT from the oscillator 160. The divider 170 may divide a frequency of the output frequency signal FOUT, based on a given division ratio. For example, the division ratio may be adjusted by a second input signal IS2 received from an external device. The second input signal IS2 may be a digital signal including a digital value. The division ratio may be a ratio at which the frequency of the output frequency signal FOUT is divided to a frequency of a division frequency signal, based on the second input signal IS2.

The divider 170 may divide the frequency of the output frequency signal FOUT to generate a compensation frequency signal FAFC and the division frequency signal FDIV. For example, a frequency of the compensation frequency signal FAFC and a frequency of the division frequency signal FDIV may be equal or different. The division frequency signal FDIV may be transferred to the phase detector 110 and the delta-sigma modulator 175, and the compensation frequency signal FAFC may be transferred to the automatic frequency calibrator 180.

The spread-spectrum clock generator 173 may generate a spread-spectrum clock signal SCK. The spread-spectrum clock generator 173 may provide the spread-spectrum clock signal SCK to the delta-sigma modulator 175.

The delta-sigma modulator 175 may receive the spread-spectrum clock signal SCK and the division frequency signal FDIV. The delta-sigma modulator 175 may perform delta-sigma modulation, based on the spread-spectrum clock signal SCK. The delta-sigma modulator 175 may dither the division ratio of the divider 170 based on a result of the delta-sigma modulation, and the dithering of the delta-sigma modulator 175 may be performed in synchronization with the division frequency signal FDIV. By the dithering, an average of the division ratio of the divider 170 may be adjusted to a value that is not an integer (e.g., a value having a point value).

The automatic frequency calibrator 180 may receive the reference frequency signal FREF and the compensation frequency signal FAFC. The automatic frequency calibrator 180 may compare a frequency of the reference frequency signal FREF and a frequency of the compensation frequency signal FAFC and may generate the variation control signal VC and a gain control signal GS depending on a comparison result.

The automatic frequency calibrator 180 may compensate for a gain of the oscillator 160, using the gain control signal GS. Based on the variation control signal VC, the automatic frequency calibrator 180 may control variations such as PVT variations of the digital-to-analog converter 150 or the overall circuit of the phase locked loop 100.

The adder 185 may receive the gain control signal GS from the automatic frequency calibrator 180 and may receive a first input signal IS1 from the external device. The first input signal IS1 may be a digital signal including a digital value. The gain control signal GS may be a digital signal including a digital value. The adder 185 may add a value of the gain control signal GS and a value of the first input signal IS1 so as to be output as the digital compensation signal CS.

The first input signal IS1 and the second input signal IS2 may be adjusted in association with each other. For example, as a value of the first input signal IS1 increases, a frequency of the output frequency signal FOUT may increase. In this case, the second input signal IS2 may be also increased, and thus, the division ratio of the divider 170 may be increased.

As a value of the first input signal IS1 decreases, a frequency of the output frequency signal FOUT may decrease. In this case, the second input signal IS2 may be also decreased, and thus, the division ratio of the divider 170 may be decreased.

The phase locked loop 100 according to an embodiment of the present disclosure may increase the frequency of the output frequency signal FOUT by increasing the value of the first input signal IS1 and the value of the second input signal IS2. Also, the phase locked loop 100 according to an embodiment of the present disclosure may decrease the frequency of the output frequency signal FOUT by decreasing the value of the first input signal IS1 and the value of the second input signal IS2. Accordingly, it is easy to adjust the frequency of the output frequency signal FOUT of the phase locked loop 100.

Figure 2:
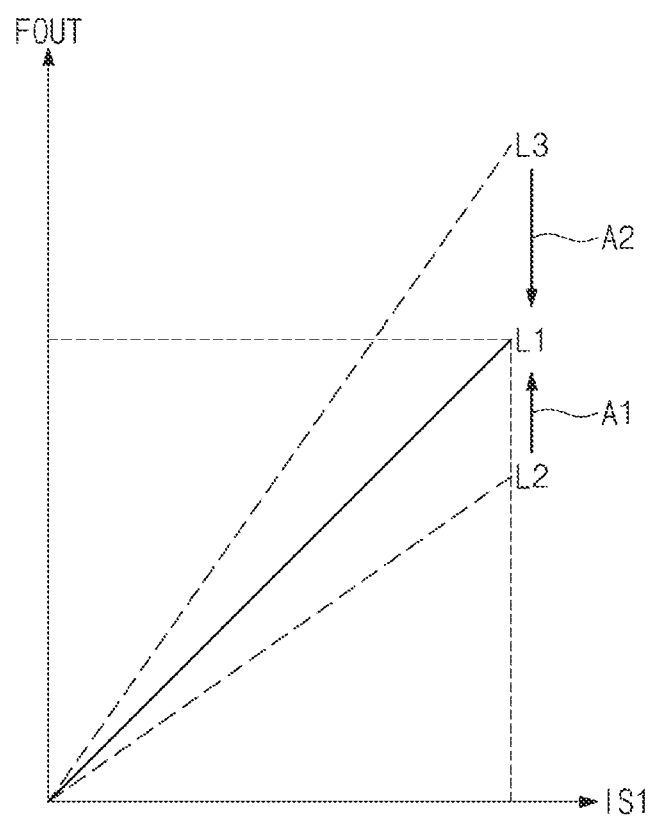
FIG. 2 illustrates a frequency of an output frequency signal according to a value of a first input signal.

FIG. 2 illustrates a frequency of the output frequency signal FOUT according to a value of the first input signal IS1. In FIG. 2, a horizontal axis represents a value of the first input signal IS1, and a vertical axis represents a frequency of the output frequency signal FOUT.

Referring to FIG. 1 and FIG. 2, a first line L1 corresponding to a solid line may be a trend line of a target frequency of the output frequency signal FOUT according to a value of the first input signal IS1. In an embodiment, because the frequency of the output frequency signal FOUT is controlled by the digital compensation signal CS, an actual frequency of the output frequency signal FOUT according to the value of the first input signal IS1 may be in the shape of a stair.

Due to variations such as PVT variations of the digital-to-analog converter 150 and/or any other component(s) of the phase locked loop 100, the actual frequency of the output frequency signal FOUT according to the value of the first input signal IS1 may correspond to any trend line (e.g., a straight line) within a range defined by a second line L2 and a third line L3.

In the case where the trend line of the frequency of the output frequency signal FOUT according to the value of the first input signal IS1 does not follow the first line L1, even though the value of the first input signal IS1 and the value of the second input signal IS2 are adjusted, the frequency of the output frequency signal FOUT may be different from the target frequency. That is, there may be required additional settling for locking the frequency of the output frequency signal FOUT to the target frequency.

The automatic frequency calibrator 180 or the overall circuit of the phase locked loop 100 according to an embodiment of the present disclosure may calibrate variations such as PVT variations as marked by a first arrow A1 or a second arrow A2. Accordingly, the frequency of the output frequency signal FOUT according to the value of the first input signal IS1 may correspond to the first line L1. This means that an additional settling operation is not required. That is, a locking time of the phase locked loop 100, for example, a time necessary for a settling operation decreases, and an operating speed of the phase locked loop 100 is improved.

Figure 3:
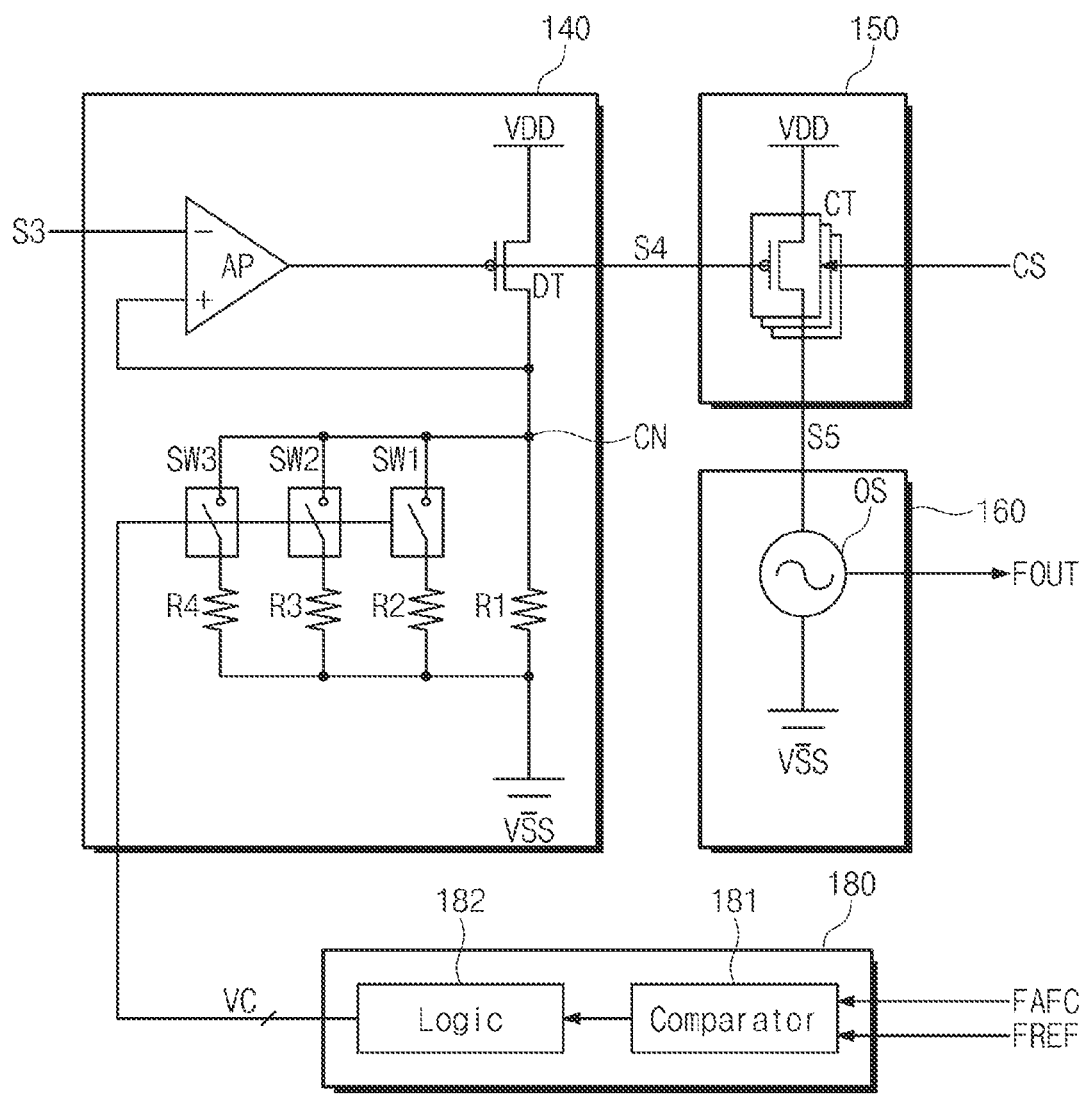
FIG. 3 illustrates a voltage-to-current converter, a digital-to-analog converter, an oscillator, and an automatic frequency calibrator, according to an embodiment based on FIG. 1.

FIG. 3 illustrates the voltage-to-current converter 140, the digital-to-analog converter 150, the oscillator 160, and the automatic frequency calibrator 180, according to an embodiment based on FIG. 1. Referring to FIG. 1 and FIG. 3, the voltage-to-current converter 140 may include an amplifier AP, a drive transistor DT, first resistor R1, second resistor R2, third resistor R3 and fourth resistor R4, and first switch SW1, second switch SW2 and third switch SW3. The first switch SW1, second switch SW2 and third switch SW3 may be collectively referred to as a first group of switches.

The amplifier AP may receive the third signal S3 through a negative input (−). A positive input (+) of the amplifier AP may be connected with a common node CN. An output of the amplifier AP may be connected with a gate of the drive transistor DT. The output of the amplifier AP may be the fourth signal S4.

The gate of the drive transistor DT may be connected with the output of the amplifier AP to receive the fourth signal S4. A first terminal of the drive transistor DT may be connected with a power node to which a power supply voltage VDD is supplied. A second terminal of the drive transistor DT may be connected with the common node CN.

The first resistor R1 may be connected between the common node CN and a ground node to which a ground voltage VSS is supplied. The first switch SW1 and the second resistor R2 may be connected between the common node CN and the ground node and may be connected in parallel with the first resistor R1. The second switch SW2 and the third resistor R3 may be connected between the common node CN and the ground node and may be connected in parallel with the first resistor R1. The third switch SW3 and the fourth resistor R4 may be connected between the common node CN and the ground node and may be connected in parallel with the first resistor R1.

One resistor among the second resistor R2, the third resistor R3 and the fourth resistor R4 and one switch corresponding to (e.g., connected with) the one resistor from among the first switch SW1, the second switch SW2 and the third switch SW3 may be individually called a "first selective resistor", and together these resistors and switches may be collectively referred to as a first group of selective resistors. Each of the first group of selective resistors may be connected in parallel with the first resistor R1 and may selectively provide a resistance value between the common node CN and the ground node. Each of the first group of selective resistors thus includes a resistor (i.e., one of the second resistor R2, the third resistor R3 and the fourth resistor R4) and one of the first group of switches connected in series.

The voltage-to-current converter 140 may convert a voltage level of the third signal S3 into a current flowing through the drive transistor DT.

The digital-to-analog converter 150 may include a plurality of converting transistors CT. A gate of each of the plurality of converting transistors CT may receive the fourth signal S4. A first terminal of each of the plurality of converting transistors CT may be connected with the power node to which the power supply voltage VDD is supplied. A second terminal of each of the plurality of converting transistors CT may be connected with an output of the digital-to-analog converter 150.

Each of the plurality of converting transistors CT may be activated or deactivated by the digital compensation signal CS. The deactivated converting transistor may not pass a current regardless of the fourth signal S4. A number of converting transistors CT, which are activated to pass a current to the oscillator, from among the converting transistors CT is adjusted based on the digital compensation signal CS.

The activated converting transistor may pass a current in response to the fourth signal S4. For example, the activated converting transistor may copy and pass a current flowing through the drive transistor DT. The amount of current that the activated converting transistor passes may be defined by a ratio of a size of the activated converting transistor (e.g., a channel size thereof) and a size of the drive transistor DT (e.g., a channel size thereof). A total sum of the amounts of currents that activated converting transistors pass may be output as the fifth signal S5.

In an embodiment, the size of each of the plurality of converting transistors CT may be equal to the size of the drive transistor DT. For another example, a size of at least one converting transistor among the plurality of converting transistors CT may be equal to the size of the drive transistor DT, and sizes of the remaining converting transistors may be different from the size of the drive transistor DT.

The sizes of the remaining converting transistors may be defined by a specific ratio. For example, a size of one of the remaining converting transistors may be n times a size of another of the remaining converting transistors (n being a positive number).

The digital-to-analog converter 150 may output a current, the amount of which corresponds to a value of the digital compensation signal CS, as the fifth signal S5. The fifth signal S5 reflects calibration of the digital-to-analog converter 150 based on the fourth signal S4.

The oscillator 160 may include an oscillation element OS that outputs the output frequency signal FOUT having a frequency corresponding to the amount of current of the fifth signal S5. The oscillation element OS may be connected between the output of the digital-to-analog converter 150 and the ground node to which the ground voltage VSS is applied.

The automatic frequency calibrator 180 may include a comparator 181 and logic 182. The comparator 181 may provide the logic 182 with a signal corresponding to a difference between the frequency of the compensation frequency signal FAFC and the frequency of the reference frequency signal FREF. For example, the comparator 181 may be implemented to be similar to the phase detector 110. As is traditional in the field(s) of the inventive concept(s) described herein, examples may be described and illustrated in terms of elements labeled as logic or similar terms and which carry out a described function or functions. These labelled elements, or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting such labelled elements may be implemented by dedicated hardware, or by a processor (e.g., one or more programmed microprocessors and associated circuitry), or by a combination of dedicated hardware to perform some functions of the labelled element and a processor to perform other functions of the labelled element. Each labelled element of the examples may be physically separated into two or more interacting and discrete circuits without departing from the scope of the present disclosure. Likewise, the labelled elements of the examples such as the logic 182 or any other logic described herein may be physically combined into more complex circuits without departing from the scope of the present disclosure.

The logic 182 may output the variation control signal VC based on an output of the comparator 181. When a specific number of converting transistors CT among the converting transistors CT are activated, the automatic frequency calibrator compensates for the voltage-to-current converter 140. The variation control signal VC may include signals, the number of which corresponds to the number of the first group of switches (i.e., the number of the first switch SW1, the second switch SW2 and the third switch SW3). The signals of the variation control signal VC may be respectively transferred to the first switch SW1, the second switch SW2 and the third switch SW3. That is, the logic 182 may turn on or turn off the first switch SW1, the second switch SW2 and the third switch SW3, independently of each other.

Figure 4:
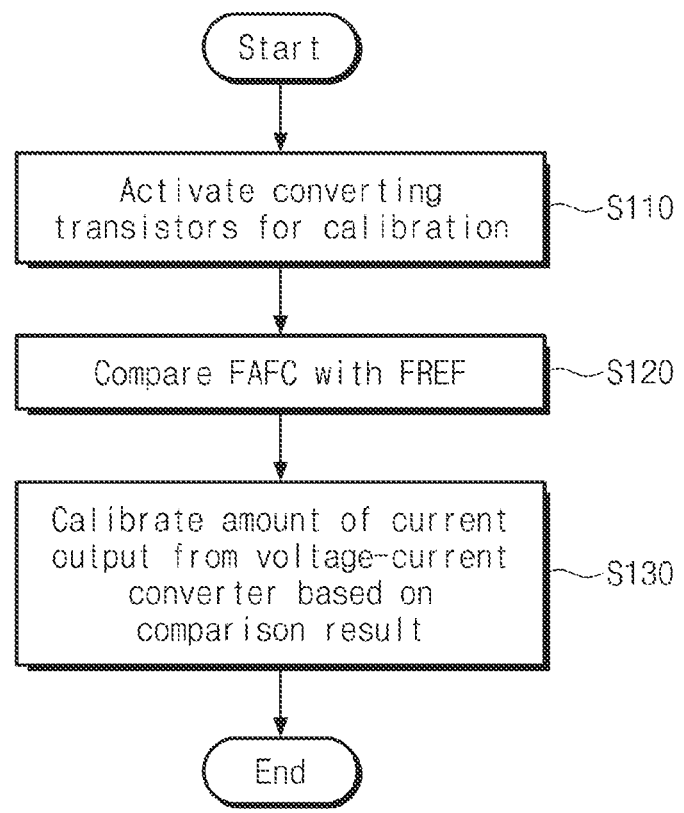
FIG. 4 illustrates an operating method of a phase locked loop.

FIG. 4 illustrates an operating method of the phase locked loop 100. Referring to FIG. 1, FIG. 2, FIG. 3, and FIG. 4, in operation S110, the phase locked loop 100 may activate the converting transistors CT for calibration. For example, all the converting transistors CT may be activated. In an embodiment, the value of the first input signal IS1 and the value of the second input signal IS2 may be adjusted to values for calibration. Alternatively, the value of the first input signal IS1 and the value of the second input signal IS2 may be maintained at existing values without adjustment.

In operation S120, the automatic frequency calibrator 180 may compare the frequency of the compensation frequency signal FAFC and the frequency of the reference frequency signal FREF.

In operation S130, the automatic frequency calibrator 180 may calibrate the amount of current output from the voltage-to-current converter 140, depending on a comparison result. For example, the automatic frequency calibrator 180 may adjust the amount of current output from the voltage-to-current converter 140 by turning on or turning off the first switch SW1, the second switch SW2 and the third switch SW3 independently of each other.

When one of the first switch SW1, the second switch SW2 and the third switch SW3 switches from a turn-off state to a turn-on state, a resistance value of the corresponding resistor may be connected in parallel with the first resistor R1. That is, a resistance value between the common node CN and the ground node may decrease. Accordingly, the amount of current flowing through the drive transistor DT may increase.

When one of the first switch SW1, the second switch SW2 and the third switch SW3 switches from a turn-on state to a turn-off state, a resistance value of the corresponding resistor may not be connected (e.g., may be disconnected from being) in parallel with the first resistor R1. That is, a resistance value between the common node CN and the ground node may increase. Accordingly, the amount of current flowing through the drive transistor DT may decrease. A resistance value of one of the first group of selective resistors (i.e., of one of the second resistor R2, the third resistor R3 and the fourth resistor R4) may be two times a resistance value of the first resistor R1, and a resistance value of another of the first group of selective resistors (another of the second resistor R2, the third resistor R3 and the fourth resistor R4) may be two times a resistance value of the one of the first group of selective resistors. Accordingly, turning on and off the first switch SW1, the second switch SW2 and the third switch SW3 may change the relative resistance value between the common node CN and the ground node between a variety of resistance values.

In an embodiment, in the case where the frequency of the reference frequency signal FREF and the frequency of the compensation frequency signal FAFC are equal in a state where all the converting transistors CT are turned on, the frequency of the output frequency signal FOUT according to the value of the first input signal IS1 may follow the trend line corresponding to the first line L1 of FIG. 2. That is, variations such as PVT variations may be calibrated.

In an embodiment, to enforce the linearity of the frequency of the output frequency signal FOUT according to the value of the first input signal IS1, the signals of the variation control signal VC may vary depending on a range to which the value of the first input signal IS1 belongs.

The range of the value of the first input signal IS1 may be divided into two or more sub-ranges. The automatic frequency calibrator 180 may detect the variation control signal VC corresponding to each of the sub-ranges. For example, in each of the sub-ranges, the value of the first input signal IS1 may be set to a maximum value of the corresponding range. The automatic frequency calibrator 180 may detect the variation control signals VC respectively corresponding to the sub-ranges, and in a normal operation, may differently adjust the variation control signals VC depending on the value of the first input signal IS1.

In an embodiment, the automatic frequency calibrator 180 may perform a compensation operation for compensating for a gain of the oscillator 160. In the compensation operation, the value of the first input signal IS1 may be fixed. For example, the value of the first input signal IS1 may be fixed to a minimum value, a maximum value, a mean value, etc.

The automatic frequency calibrator 180 may detect a value of the gain control signal GS at which the frequency of the compensation frequency signal FAFC and the frequency of the reference frequency signal FREF are equal. When there is detected the value of the gain control signal GS at which the frequency of the compensation frequency signal FAFC and the frequency of the reference frequency signal FREF are equal, the compensation operation may be terminated. In a normal operation for generating the output frequency signal FOUT, the automatic frequency calibrator 180 may compensate for the gain of the oscillator 160 by providing the gain control signal GS including the detected value to the adder 185.

In an embodiment, the automatic frequency calibrator 180 may differently set a value of the gain control signal GS depending on a range to which the value of the first input signal IS1 belongs. The range of the value of the first input signal IS1 may be divided into two or more sub-ranges. The automatic frequency calibrator 180 may detect the gain control signal GS corresponding to each of the sub-ranges. For example, in each of the sub-ranges, the value of the first input signal IS1 may be set to a minimum value, a maximum value, a mean value, etc. of the corresponding range. The automatic frequency calibrator 180 may detect the value of the gain control signal GS corresponding to each of the sub-ranges, and in the normal operation, may differently adjust the value of the gain control signal GS depending on the value of the first input signal IS1.

Figure 5:
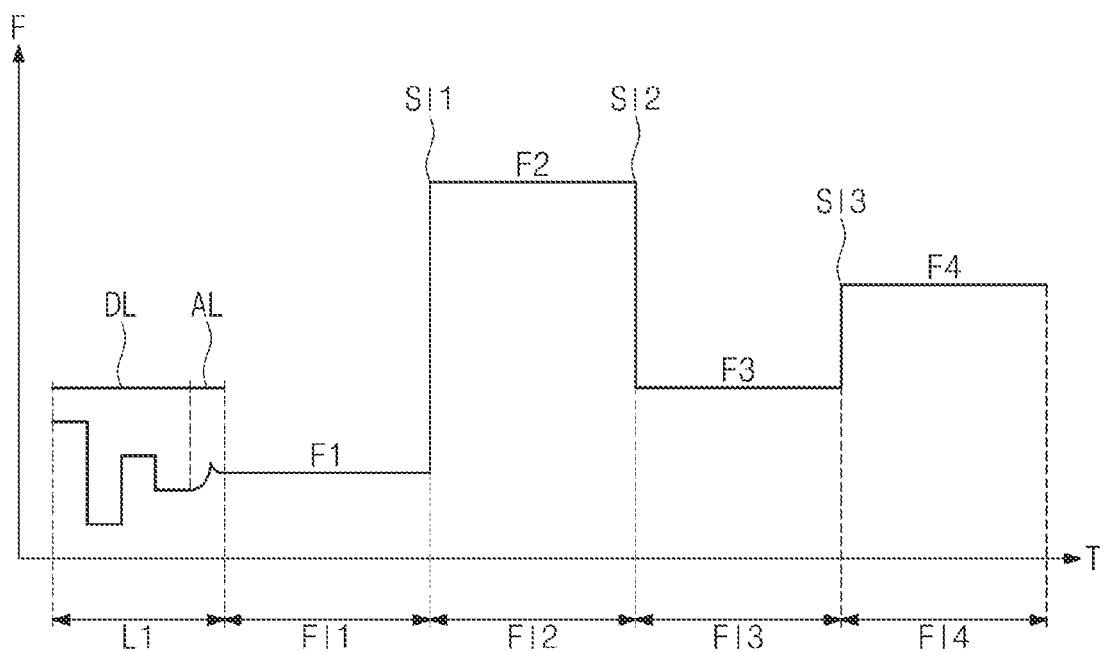
FIG. 5 illustrates an example in which a phase locked loop according to an embodiment of the present disclosure locks a frequency of an output frequency signal.

FIG. 5 illustrates an example in which the phase locked loop 100 according to an embodiment of the present disclosure locks the frequency of the output frequency signal FOUT. Referring to FIG. 1, FIG. 3, and FIG. 5, when a power is supplied to the phase locked loop 100, the phase locked loop 100 may perform a locking operation during a locking interval LI.

The locking operation may include digital locking DL and analog locking AL. The digital locking DL may adjust the value of the first input signal IS1 or the value of the gain control signal GS and may adjust the frequency of the output frequency signal FOUT to be similar to the target frequency (e.g., a first frequency F1). The analog locking AL may adjust the variation control signal VC and may adjust the frequency of the output frequency signal FOUT to be matched with the first frequency F1 (e.g., within an error range).

In an embodiment, a compensation operation of searching for the value of the gain control signal GS or a calibration operation of adjusting the variation control signal VC may be performed together during the locking operation. When the locking operation is completed, during a first frequency interval FI1, the phase locked loop 100 may output the output frequency signal FOUT having the first frequency F1.

When the value of the first input signal IS1 and the value of the second input signal IS2 are changed, a first settling operation SI1 of adjusting the frequency of the output frequency signal FOUT of the phase locked loop 100 may be performed. As described with reference to FIG. 1, FIG. 2, FIG. 3 and FIG. 4, because variations such as PVT variations are calibrated, the frequency of the output frequency signal FOUT may reach the target frequency (e.g., a second frequency F2) only by adjusting the value of the first input signal IS1 and the value of the second input signal IS2.

Alternatively, because the frequency of the output frequency signal FOUT is adjusted to be similar to the second frequency F2, the digital locking DL may be omitted, and a time necessary for the analog locking AL may be decreased. That is, a time necessary for the settling operation may be shortened or removed. Afterwards, during a second frequency interval FI2, the frequency of the output frequency signal FOUT of the phase locked loop 100 may be the second frequency F2.

Next, through a second settling operation SI2, the frequency of the output frequency signal FOUT of the phase locked loop 100 may be adjusted to a third frequency F3. During a third frequency interval FI3, the frequency of the output frequency signal FOUT of the phase locked loop 100 may be the third frequency F3.

Then, through a third settling operation SI3, the frequency of the output frequency signal FOUT of the phase locked loop 100 may be adjusted to a fourth frequency F4. During a fourth frequency interval FI4, the frequency of the output frequency signal FOUT of the phase locked loop 100 may be the fourth frequency F4.

As described above, a time necessary for the settling operation of the phase locked loop 100 may be removed or shortened. Accordingly, a time period in which an electronic device including the phase locked loop 100 waits during the settling operation of the phase locked loop 100 may be removed or shortened. That is, an operating speed of the electronic device including the phase locked loop 100 may be improved, and unnecessary power consumption (e.g., power consumption during a waiting time) may decrease.

Figure 6:
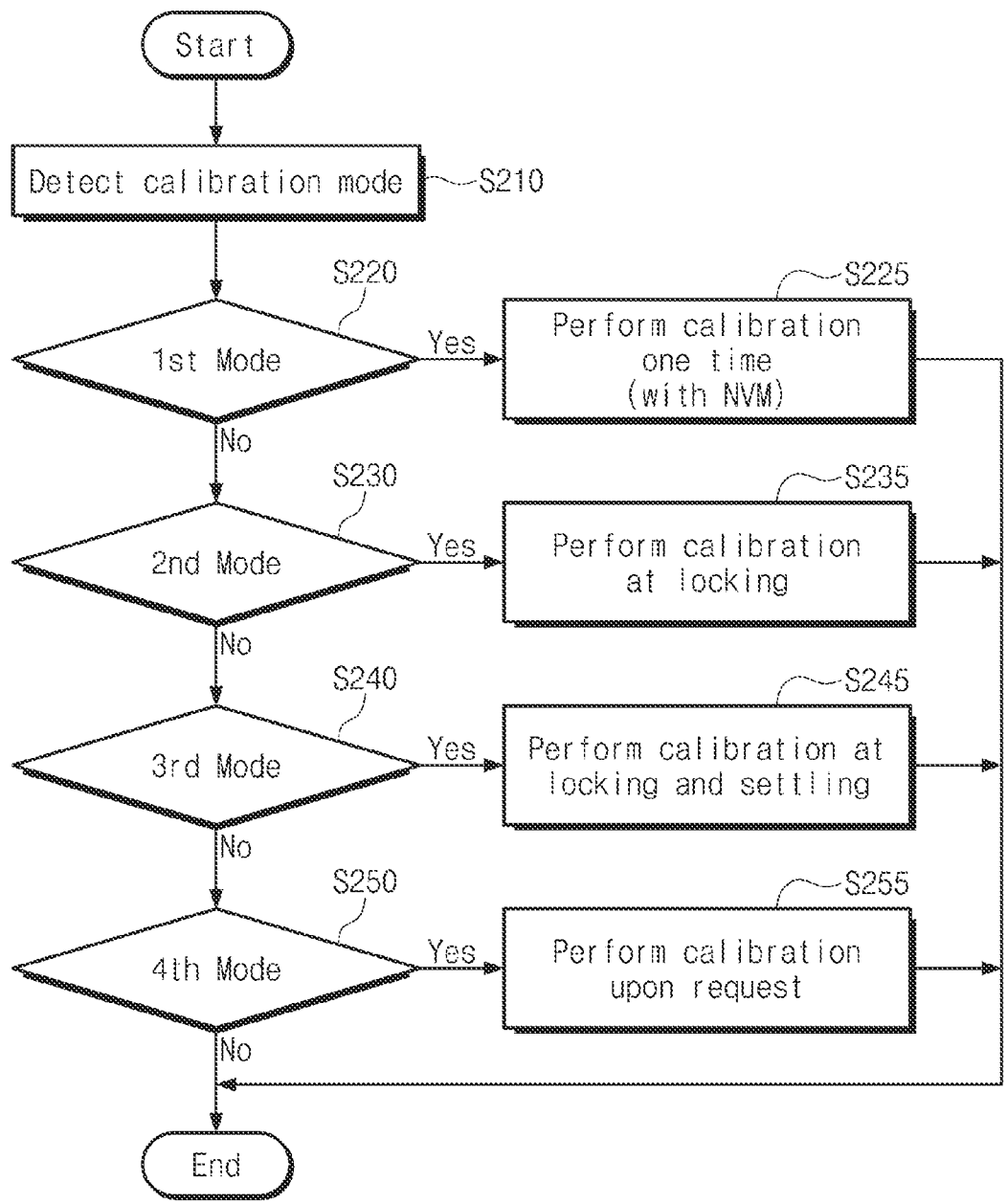
FIG. 6 illustrates an example of a flowchart in which a phase locked loop performs a calibration operation depending on mode settings.

FIG. 6 illustrates an example of a flowchart in which the phase locked loop 100 performs a calibration operation depending on mode settings. Referring to FIG. 1, FIG. 2, FIG. 3, FIG. 4, FIG. 5 and FIG. 6, as a power is supplied to the phase locked loop 100, in operation S210, the phase locked loop 100 may detect a calibration mode.

In operation S220, when the calibration mode is set to a first mode, operation S225 is performed. In operation S225, the phase locked loop 100 may be set to perform the calibration operation only once. For example, the phase locked loop 100 may include nonvolatile memory elements NVM for storing a result of the calibration operation.

The phase locked loop 100 may store the result of the calibration operation in the nonvolatile memory elements NVM. In response to the power of the phase locked loop 100 being interrupted and the power then again being supplied to the phase locked loop 100, the phase locked loop 100 may read the result of the calibration operation stored in the nonvolatile memory elements NVM.

When it is determined in operation S220 that the calibration mode is not the first mode, operation S230 is performed. When it is determined in operation S230 that the calibration mode is set to a second mode, operation S235 is performed. In operation S235, the phase locked loop 100 may be set to perform the calibration operation when performing the locking operation.

When it is determined in operation S230 that the calibration mode is not the second mode, operation S240 is performed. When it is determined in operation S240 that the calibration mode is set to a third mode, operation S245 is performed. In operation S245, the phase locked loop 100 may be set to perform the calibration operation when performing the locking operation and the settling operation.

When it is determined in operation S240 that the calibration mode is not the third mode, operation S250 is performed. When it is determined in operation S250 that the calibration mode is set to a fourth mode, operation S255 is performed. In operation S255, the phase locked loop 100 may be set to perform the calibration operation depending on a request of the external device.

When it is determined in operation S250 that the calibration mode is not the fourth mode, the phase locked loop 100 may not perform the calibration operation. Afterwards, the process may end.

In an embodiment, the compensation operation may also be performed to be identical to that described with reference to FIG. 6. For example, the phase locked loop 100 may be set to perform the compensation operation only once (refer to operation S225), to perform the compensation operation during the locking operation (refer to operation S235), to perform the compensation operation during the locking operation and the settling operation (refer to operation S245), or to perform the compensation operation depending on a request of the external device (refer to operation S255).

Figure 7:
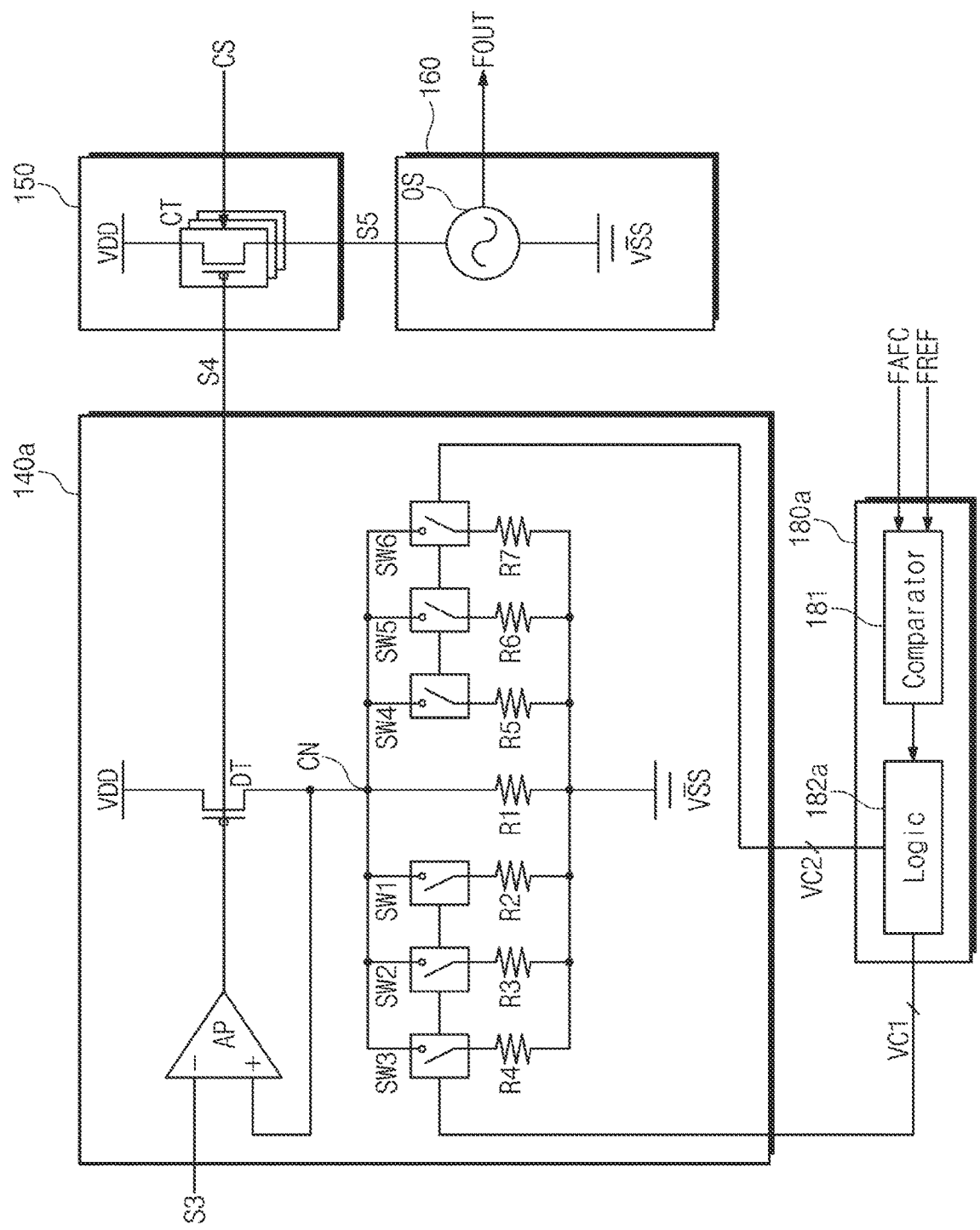
FIG. 7 illustrates a voltage-to-current converter, a digital-to-analog converter, an oscillator, and an automatic frequency calibrator, according to another embodiment based on FIG. 1.

FIG. 7 illustrates a voltage-to-current converter 140a, the digital-to-analog converter 150, the oscillator 160, and an automatic frequency calibrator 180a, according to another embodiment based on FIG. 1. Referring to FIG. 1, FIG. 2, FIG. 3, FIG. 4, FIG. 5, FIG. 6 and FIG. 7, the voltage-to-current converter 140a may include the amplifier AP, the drive transistor DT, first resistor R1, second resistor R2, third resistor R3, fourth resistor R4, fifth resistor R5, sixth resistor R6 and seventh resistor R7, and first switch SW1, second switch SW2, third switch SW3, fourth switch SW4, fifth switch SW5 and sixth switch SW6. The fourth switch SW4, the fifth switch SW5 and the sixth switch SW6 may be collectively referred to as a second group of switches.

Configurations and operations of the amplifier AP, the drive transistor DT, the first resistor R1 to fourth resistor R4, and the first switch SW1, the second switch SW2 and the third switch SW3 may be identical to those described with reference to FIG. 3. Thus, additional description will be omitted to avoid redundancy.

Compared to the voltage-to-current converter 140 of FIG. 3, the voltage-to-current converter 140a may further include the fifth resistor R5, the sixth resistor R6 and the seventh resistor R7 and the fourth switch SW4, the fifth switch SW5 and the sixth switch SW6.

The fourth switch SW4 and the fifth resistor R5 may be connected between the common node CN and the ground node and may be connected in parallel with the first resistor R1. The fifth switch SW5 and the sixth resistor R6 may be connected between the common node CN and the ground node and may be connected in parallel with the first resistor R1. The sixth switch SW6 and the seventh resistor R7 may be connected between the common node CN and the ground node and may be connected in parallel with the first resistor R1.

One resistor among the fifth resistor R5, the sixth resistor R6 and the seventh resistor R7 and one switch corresponding to (e.g., connected with) the one resistor from among the fourth switch SW4, the fifth switch SW5 and the sixth switch SW6 may be individually called a "second selective resistor", and together the resistors and switches may be referred to as a second group of selective resistors. Each of the second group of selective resistors may be connected in parallel with the first resistor R1 and may selectively provide a resistance value between the common node CN and the ground node. Each of the second group of selective resistors thus includes a resistor (i.e., one of the fifth resistor R5, the sixth resistor R6 and the seventh resistor R7) and one of the second group of switches connected in series.

Configurations and operations of the digital-to-analog converter 150 and the oscillator 160 are identical to those described with reference to FIG. 3. Thus, additional description will be omitted to avoid redundancy.

The automatic frequency calibrator 180a may include the comparator 181 and logic 182a. A configuration and an operation of the comparator 181 are identical to those described with reference to FIG. 3. Thus, additional description will be omitted to avoid redundancy. A total resistance value of the second group of selective resistors may be adjusted by the automatic frequency calibrator 180a in a settling operation. The automatic frequency calibrator 180a may adjust a total resistance value of the second group of selective resistors in a locking operation.

The logic 182a may output a first variation control signal VC1 and a second variation control signal VC2. The first variation control signal VC1 may include signals controlling the first switch SW1, the second switch SW2 and the third switch SW3 independently of each other. The second variation control signal VC2 may include signals controlling the fourth switch SW4, the fifth switch SW5 and the sixth switch SW6 independently of each other.

In an embodiment, in the calibration operation, the logic 182a may find the first variation control signal VC1 compensating for the variations such as PVT variations. When the first variation control signal VC1 is set, the logic 182a may maintain the first variation control signal VC1 until a next calibration operation.

The logic 182a may perform analog locking by using the second variation control signal VC2. For example, when the first input signal IS1 and the second input signal IS2 are adjusted and there is a difference between the frequency of the output frequency signal FOUT and the target frequency, the logic 182a may adjust the second variation control signal VC2. For example, the logic 182a may adjust the second variation control signal VC2 such that the frequency of the output frequency signal FOUT and the target frequency are equal.

In an embodiment, a current amount of the drive transistor DT controlled by the first variation control signal VC1 may be different from a current amount of the drive transistor DT controlled by the second variation control signal VC2. That is, the logic 182a may adjust the current amount of the drive transistor DT with different resolutions in the calibration operation and the analog locking.

Figure 8:
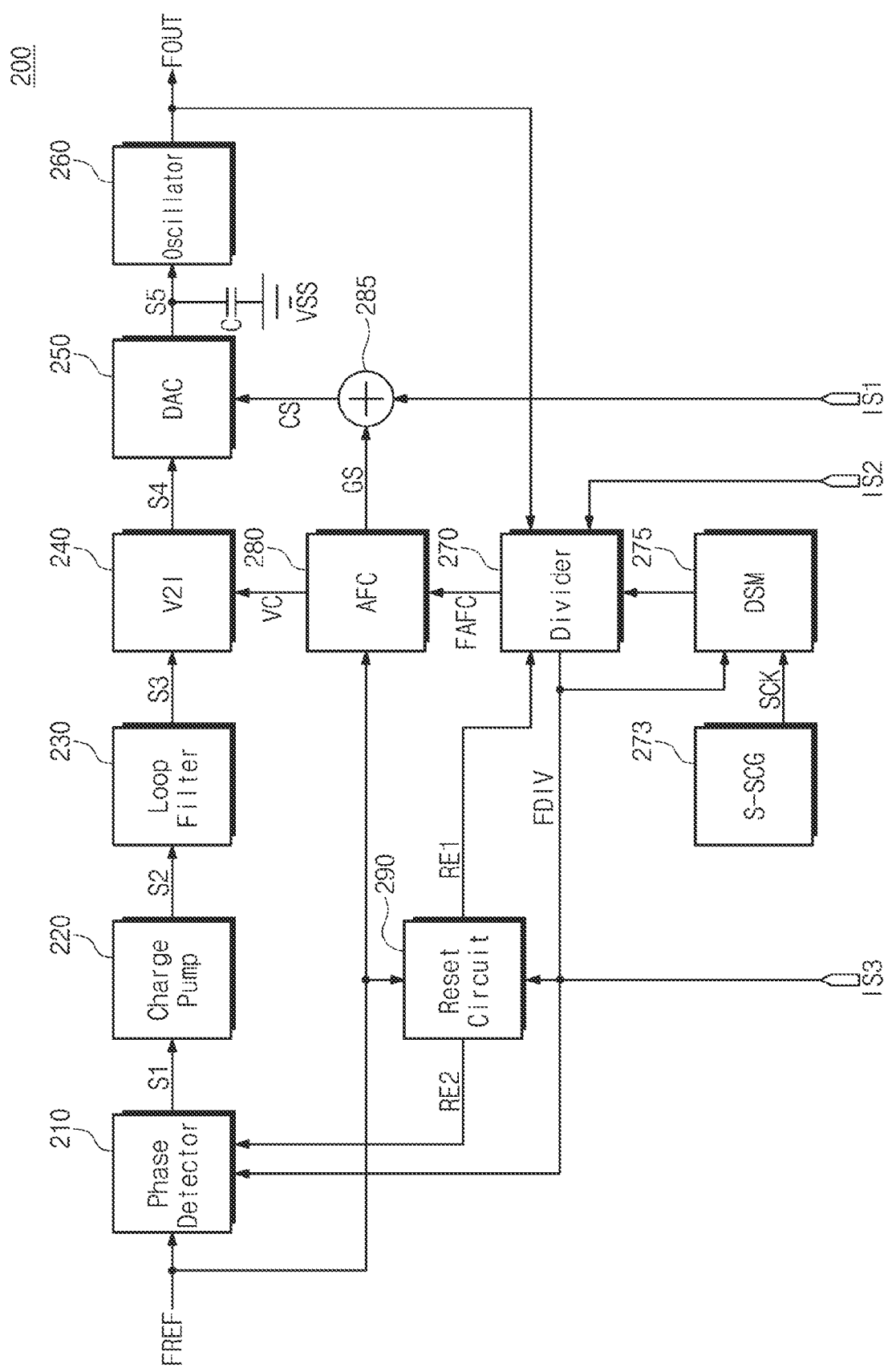
FIG. 8 illustrates a phase locked loop according to some embodiments of the present disclosure.

FIG. 8 illustrates a phase locked loop 200 according to some embodiments of the present disclosure. Referring to FIG. 8, the phase locked loop 200 may include a capacitor "C", a phase detector 210, a charge pump 220, a loop filter 230, a voltage-to-current converter 240 (V2I), a digital-to-analog converter 250 (DAC), an oscillator 260, a divider 270, a spread-spectrum clock generator 273 (S-SCG), a delta-sigma modulator 275 (DSM), an automatic frequency calibrator 280 (AFC), an adder 285, and a reset circuit 290.

Configurations and operations of the capacitor "C", the charge pump 220, the loop filter 230, the voltage-to-current converter 240, the digital-to-analog converter 250, the oscillator 260, the spread-spectrum clock generator 273, the delta-sigma modulator 275, the automatic frequency calibrator 280, and the adder 285 may be identical to those of the capacitor "C", the charge pump 120, the loop filter 130, the voltage-to-current converter 140, the digital-to-analog converter 150, the oscillator 160, the spread-spectrum clock generator 173, the delta-sigma modulator 175, the automatic frequency calibrator 180, and the adder 185 described with reference to FIG. 1. Thus, additional description will be omitted to avoid redundancy.

Compared with the phase locked loop 100 of FIG. 1, the phase locked loop 200 may further include the reset circuit 290. The reset circuit 290 may receive a third input signal IS3 from the external device. For example, in response to the first input signal IS1 and the second input signal IS2 being adjusted, the third input signal IS3 may also be activated and may then be deactivated.

The reset circuit 290 is configured to reset the divider 270 and the phase detector 210 in response to which a settling operation is performed. In the settling operation, the division ratio may be adjusted by the second input signal IS2 and the frequency of the output frequency signal may be adjusted by the first input signal IS1. In response to the third input signal IS3 being activated, the reset circuit 290 may activate a first reset signal RE1 to be transferred to the divider 270 to reset the divider 270. A configuration and an operation of the divider 270 may be identical to those of the divider 170 of FIG. 1 except that the divider 270 is reset in response to the first reset signal RE1.

In response to the third input signal IS3 being activated, the reset circuit 290 may activate a second reset signal RE2 to be transferred to the phase detector 210 to reset the phase detector 210. A configuration and an operation of the phase detector 210 may be identical to those of the phase detector 110 of FIG. 1 except that the phase detector 210 is reset in response to the second reset signal RE2.

The reset circuit 290 may maintain a reset of the divider 270 and the phase detector 210 during a specific time (e.g., a first time). The reset circuit 290 may release the reset of the divider 270 in synchronization with the reference frequency signal FREF. After the reset of the divider 270 is released and a specific time (e.g., a second time) passes, the reset circuit 290 may release the reset of the phase detector 210.

By resetting the divider 270 and the phase detector 210 at an appropriate timing and releasing the reset thereof, the reset circuit 290 may allow a phase of the reference frequency signal FREF and a phase of the division frequency signal FDIV to coincide with each other (e.g., within an error range). Accordingly, a time period in which the settling operation of the phase locked loop 200 is required may be further shortened.

Figure 9:
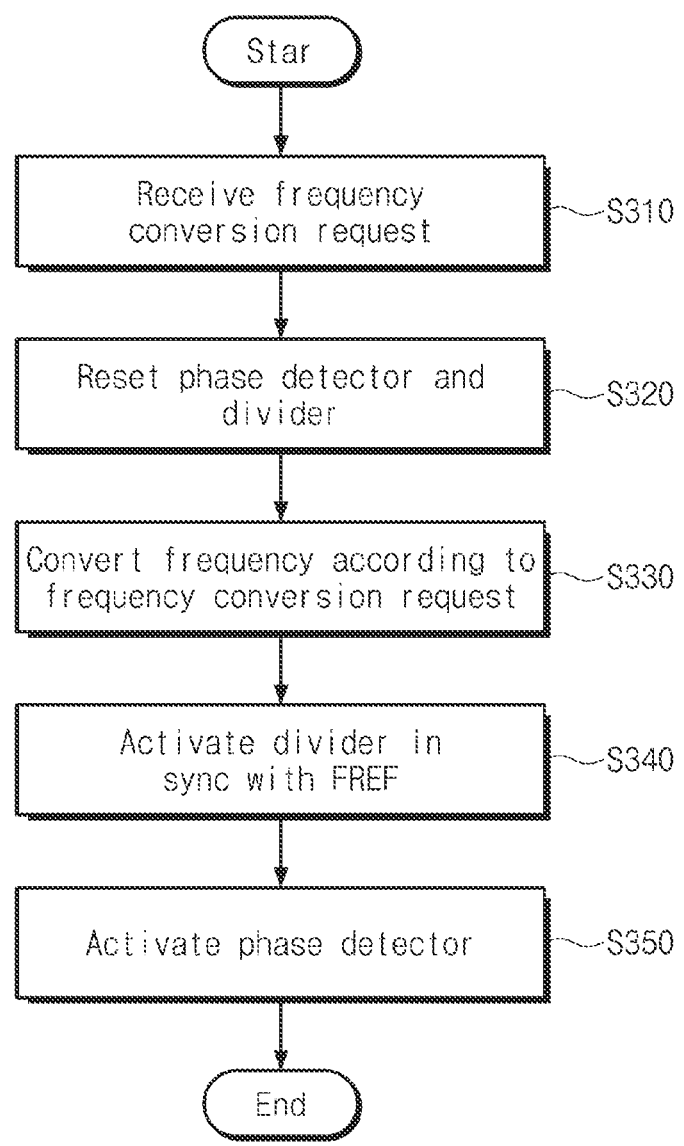
FIG. 9 is a flowchart illustrating an operating method of a phase locked loop according to an embodiment of the present disclosure.

FIG. 9 is a flowchart illustrating an operating method of the phase locked loop 200 according to an embodiment of the present disclosure. Referring to FIG. 8 and FIG. 9, in operation S310, the phase locked loop 100 may receive a frequency conversion request. For example, the frequency conversion request may be received by adjusting the first input signal IS1, the second input signal IS2, and the third input signal IS3.

In operation S320, the reset circuit 290 of the phase locked loop 100 may reset the phase detector 210 and the divider 270. For example, the reset circuit 290 may reset the phase detector 210 and the divider 270 and may maintain a reset state of the phase detector 210 and the divider 270.

In operation S330, the phase locked loop 200 may convert the frequency of the output frequency signal FOUT depending on the frequency conversion request. For example, the phase locked loop 100 may convert the frequency of the output frequency signal FOUT in response to the first input signal IS1. The phase locked loop 100 may convert the division ratio of the divider 270 in response to the second input signal IS2.

After the divider 270 and the phase detector 210 are reset and a specific time (e.g., the first time) passes, in operation S340, the reset circuit 290 of the phase locked loop 200 may release the reset state of the divider 270 in synchronization with the reference frequency signal FREF and may activate the divider 270. In response to the activation or the releasing of the reset state, the divider 270 may divide the frequency of the output frequency signal FOUT at the converted division ratio and may output the division frequency signal FDIV and the compensation frequency signal FAFC.

After the divider 270 are activated (or the reset state of the divider 270 is released) and a specific time (e.g., the second time) passes, in operation S350, the reset circuit 290 of the phase locked loop 200 may release the reset state of the phase detector 210 and may activate the phase detector 210. The phase detector 210 may start to compare the phase of the reference frequency signal FREF and the phase of the division frequency signal FDIV. In an embodiment, the specific time (e.g., the second time) may be shorter than a time corresponding to one period of the reference frequency signal FREF.

Figure 10:
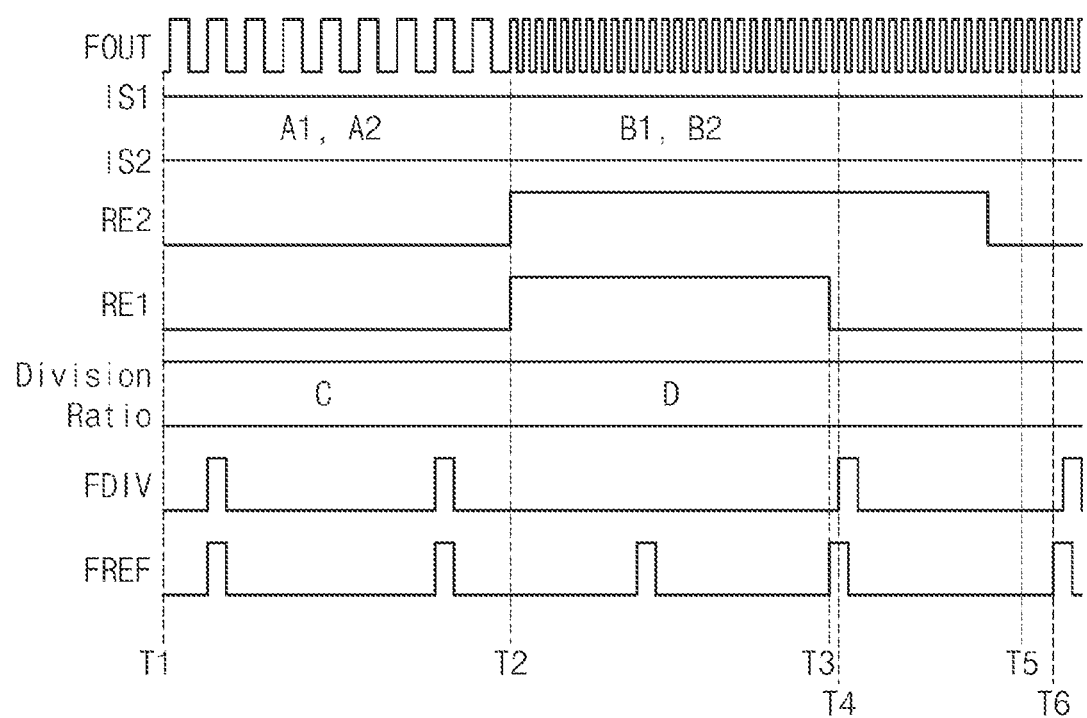
FIG. 10 illustrates an example in which a phase locked loop of FIG. 8 converts a frequency of an output frequency signal.

FIG. 10 illustrates an example in which the phase locked loop 200 of FIG. 8 converts the frequency of the output frequency signal FOUT. In an embodiment, changes of signals in the phase locked loop 200 over time are illustrated in FIG. 10.

Referring to FIG. 8 and FIG. 10, at a first timing T1, the frequency of the output frequency signal FOUT may be in a locked state. For example, the value of the first input signal IS1 may be "A1", and the frequency of the output frequency signal FOUT may correspond to "A1". The value of the second input signal IS2 may be "A2", and the division ratio of the divider 270 may correspond to "A2". For example, the division ratio may be "C".

At a second timing T2, the frequency conversion request may be received. For example, the value of the first input signal IS1 may be changed from "A1" to "B1". The value of the second input signal IS2 may be changed from "A2" to "B2". The reset circuit 290 may activate the first reset signal RE1 and may activate the second reset signal RE2.

In response to the activation of the first reset signal RE1, the divider 270 may be reset. That is, the divider 270 may stop outputting the division frequency signal FDIV. In response to the activation of the second reset signal RE2, the phase detector 210 may be reset. That is, the phase detector 210 may stop comparing the phase of the reference frequency signal FREF and the phase of the division frequency signal FDIV and may maintain the first signal S1. Accordingly, the influence of the phase detector 210 on the frequency of the output frequency signal FOUT may be blocked.

As the value of the first input signal IS1 is changed from "A1" to "B1", the frequency of the output frequency signal FOUT may be changed. As the value of the second input signal IS2 is changed from "A2" to "B2", the division ratio of the divider 270 may be changed from "C" to "D".

After a specific time (e.g., the first time) passes, at a third timing T3, the reset circuit 290 may deactivate the first reset signal RE1 in synchronization with a rising edge of the reference frequency signal FREF. In response to the first reset signal RE1 being deactivated, at a fourth timing T4, the divider 270 may start to output the division frequency signal FDIV. The division frequency signal FDIV may be delayed with respect to the reference frequency signal FREF as much as one cycle of the output frequency signal FOUT. For example, one cycle may be from one rising edge to a next rising edge.

After a specific time (e.g., the second time) passes, at a fifth timing T5, the reset circuit 290 may deactivate the second reset signal RE2. The phase detector 210 may start to compare the phase of the reference frequency signal FREF and the phase of the division frequency signal FDIV.

A rising edge of the reference frequency signal FREF may arise at a sixth timing T6. The division frequency signal FDIV may be delayed with respect to the reference frequency signal FREF as much as one cycle of the output frequency signal FOUT. The frequency of the output frequency signal FOUT may be several thousand times or more the frequency of the reference frequency signal FREF. That is, a difference between the phase of the reference frequency signal FREF and the phase of the division frequency signal FDIV may be regarded as matched (e.g., within an error range).

As described above, the phase of the division frequency signal FDIV and the phase of the reference frequency signal FREF coincide with each other by resetting the divider 270 and the phase detector 210 and releasing the reset states thereof at appropriate timings. Accordingly, a time necessary for the settling operation may be further decreased.

In an embodiment, to further decrease the time for the settling operation, a length of the second time may be shorter than one cycle of the reference frequency signal FREF. When the change of the frequency of the output frequency signal FOUT and the change of the division ratio of the divider 270 are performed during a time shorter than one cycle of the reference frequency signal, during one cycle of the reference frequency signal FREF, it may be possible to reset the divider 270 and the phase detector 210 and to release the reset states thereof. That is, the settling operation may be completed during one cycle of the reference frequency signal FREF.

Figure 11:
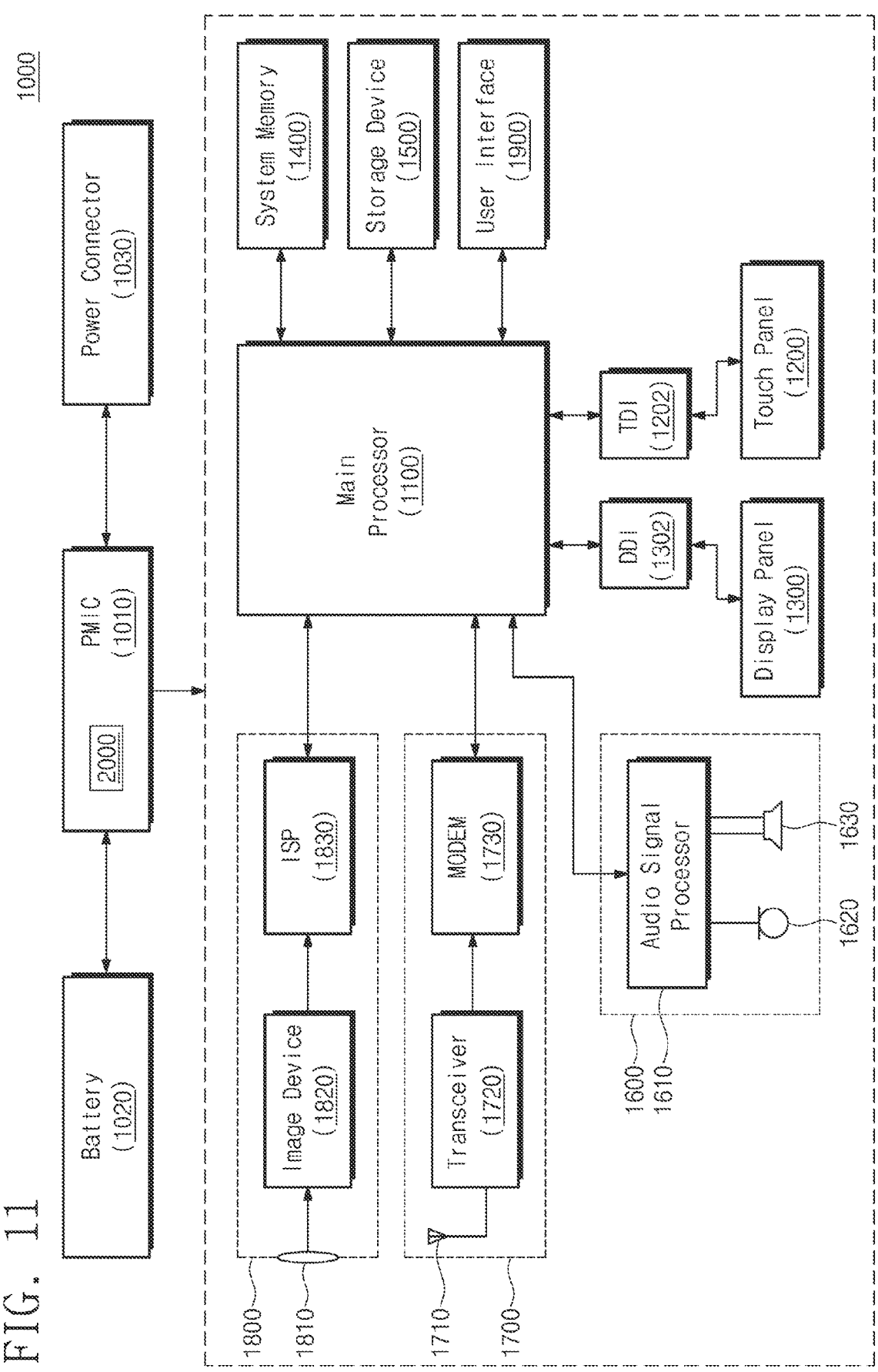
FIG. 11 illustrates an example of an electronic device including a phase locked loop of FIG. 1 or a phase locked loop of FIG. 8.

FIG. 11 illustrates an example of an electronic device 1000 including the phase locked loop 100 of FIG. 1 or the phase locked loop 200 of FIG. 8. Referring to FIG. 11, the electronic device 1000 may include a main processor 1100, a touch panel 1200, a touch driver integrated circuit 1202 (TDI), a display panel 1300, a display driver integrated circuit 1302 (DDI), a system memory 1400, a storage device 1500, an audio processor 1600, a communication block 1700, an image processor 1800, and a user interface 1900. In an embodiment, the electronic device 1000 may be one of various electronic devices such as a personal computer, a laptop computer, a server, a workstation, a portable communication terminal, a personal digital assistant (PDA), a portable media player (PMP), a digital camera, a smartphone, a tablet computer, and a wearable device.

The main processor 1100 may control overall operations of the electronic device 1000. The main processor 1100 may control/manage operations of the components of the electronic device 1000. The main processor 1100 may perform various operations for the purpose of operating the electronic device 1000. The touch panel 1200 may be configured to sense a touch input from a user under control of the touch driver integrated circuit 1202. The display panel 1300 may be configured to display image information under control of the display driver integrated circuit 1302.

The system memory 1400 may store data that are used in an operation of the electronic device 1000. For example, the system memory 1400 may include a volatile memory such as a static random access memory (SRAM), a dynamic RAM (DRAM), or a synchronous DRAM (SDRAM), and/or a nonvolatile memory such as a phase change RAM (PRAM), a magneto-resistive RAM (MRAM), a resistive RAM (ReRAM), or a ferroelectric RAM (FRAM).

The storage device 1500 may store data regardless of whether a power is supplied. For example, the storage device 1500 may include at least one of various nonvolatile memories such as a flash memory, a PRAM, an MRAM, a ReRAM, and a FRAM. For example, the storage device 1500 may include an embedded memory and/or a removable memory of the electronic device 1000.

The audio processor 1600 may process an audio signal by using an audio signal processor 1610. The audio processor 1600 may receive an audio input through a microphone 1620 or may provide an audio output through a speaker 1630. The communication block 1700 may exchange signals with an external device/system through an antenna 1710. A transceiver 1720 and a modulator/demodulator (MODEM) 1730 of the communication block 1700 may process signals exchanged with the external device/system, based on at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 1800 may receive a light through a lens 1810. An image device 1820 and an image signal processor (ISP) 1830 included in the image processor 1800 may generate image information about an external object, based on a received light. The user interface 1900 may include an interface capable of exchanging information with a user, separately from the touch panel 1200, the display panel 1300, the audio processor 1600, and the image processor 1800. The user interface 1900 may include a keyboard, a mouse, a printer, a projector, various sensors, a human body communication device, etc.

The electronic device 1000 may further include a power management IC 1010 (PMIC), a battery 1020, and a power connector 1030. The power management IC 1010 may generate an internal power from a power supplied from the battery 1020 or a power supplied from the power connector 1030, and may provide the internal power to the main processor 1100, the touch panel 1200, the touch driver integrated circuit 1202 (TDI), the display panel 1300, the display driver integrated circuit 1302 (DDI), the system memory 1400, the storage device 1500, the audio processor 1600, the communication block 1700, the image processor 1800, and the user interface 1900.

In an embodiment, each of the components of the electronic device 1000 may include the phase locked loop 100 or phase locked loop 200. Each of the components of the electronic device 1000 may communicate with any other components based on the output frequency signal FOUT generated by the phase locked loop 100 or phase locked loop 200. Each of the components of the electronic device 1000 may perform internal operations, based on the output frequency signal FOUT generated by the phase locked loop 100 or the phase locked loop 200. Accordingly, multiple of the phase locked loops described herein may be respectively provided in multiple components of an electronic device 1000.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above embodiments, components according to embodiments of the present disclosure are referenced by using blocks, and an example of such blocks is element labeled as logic. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or unique circuits protected by intellectual property (IP).

According to the present disclosure, a frequency of an output frequency signal of a phase locked loop may be adjusted to a target frequency without additional calibration. Accordingly, a phase locked loop with an improved locking speed and an operating method of the phase locked loop are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A phase locked loop, comprising:
   a phase detector configured to receive a reference frequency signal and a division frequency signal and to output a first signal corresponding to a phase difference of the reference frequency signal and the division frequency signal;
   a charge pump configured to receive the first signal and to amplify the first signal to output a second signal;
   a loop filter configured to receive the second signal and to filter the second signal to output a third signal;
   a voltage-to-current converter configured to receive the third signal and to convert and output the third signal into a fourth signal;
   a digital-to-analog converter configured to receive the fourth signal and a digital compensation signal and to output a fifth signal based on the fourth signal and the digital compensation signal;
   an oscillator configured to receive the fifth signal and to output an output frequency signal having a frequency corresponding to the fifth signal;
   a divider configured to receive the output frequency signal and to divide the frequency of the output frequency signal to output the division frequency signal and a compensation frequency signal; and
   an automatic frequency calibrator configured to receive the compensation frequency signal and the reference frequency signal and to compensate for the voltage-to-current converter based on a difference between a frequency of the compensation frequency signal and a frequency of the reference frequency signal.

2. The phase locked loop of claim 1, wherein the automatic frequency calibrator compensates for a current amount of the fourth signal, which the voltage-to-current converter outputs, based on a voltage level of the third signal.

3. The phase locked loop of claim 1, wherein the voltage-to-current converter includes:
   an amplifier configured to receive a voltage of a common node and the third signal and to output a difference of the voltage of the common node and the third signal;
   a drive transistor connected between a power node to which a power supply voltage is supplied and the common node and including a gate receiving an output signal of the amplifier;
   a first resistor connected between a ground node to which a ground voltage is supplied and the common node; and
   a first group of selective resistors connected in parallel with the first resistor between the common node and the ground node, wherein each of the first group of selective resistors includes a second resistor and a first switch connected in series.

4. The phase locked loop of claim 3, wherein the automatic frequency calibrator individually turns on or turns off the first group of switches of the first group of selective resistors.

5. The phase locked loop of claim 4, wherein the digital-to-analog converter includes converting transistors,
wherein each of the converting transistors includes:
a first terminal connected with the power node to which the power supply voltage is supplied;
a second terminal connected with the oscillator; and
a gate receiving the fourth signal.

6. The phase locked loop of claim 5, wherein a number of converting transistors, which are activated to pass a current to the oscillator, from among the converting transistors is adjusted based on the digital compensation signal.

7. The phase locked loop of claim 6, wherein, when a specific number of converting transistors among the converting transistors are activated, the automatic frequency calibrator compensates for the voltage-to-current converter.

8. The phase locked loop of claim 6, wherein, in a state where all the converting transistors are turned on, the automatic frequency calibrator compensates for the voltage-to-current converter such that the frequency of the reference frequency signal and the frequency of the compensation frequency signal are equal.

9. The phase locked loop of claim 3, wherein a resistance value of one of the first group of selective resistors is two times a resistance value of the first resistor, and
wherein a resistance value of another of the first group of selective resistors is two times the resistance value of the one of the first group of selective resistors.

10. The phase locked loop of claim 3, wherein the voltage-to-current converter further includes:
a second group of selective resistors connected in parallel with the first resistor between the common node and the ground node,
wherein each of the second group of selective resistors includes a third resistor and a second switch connected in series.

11. The phase locked loop of claim 10, wherein the automatic frequency calibrator controls the second group of switches of the second group of selective resistors independently of the first group of switches of the first group of selective resistors.

12. The phase locked loop of claim 10, wherein the automatic frequency calibrator adjusts a total resistance value of the second group of selective resistors in a settling operation.

13. The phase locked loop of claim 3, wherein the automatic frequency calibrator adjusts a total resistance value of the first group of selective resistors in a locking operation.

14. The phase locked loop of claim 1, further comprising:
an adder configured to receive a first digital input signal from an external device, to receive a digital gain control signal from the automatic frequency calibrator, and to output, as the digital compensation signal, a sum of the first digital input signal and the digital gain control signal.

15. The phase locked loop of claim 14, wherein the automatic frequency calibrator compensates for a gain of the digital-to-analog converter by using the digital gain control signal.

16. The phase locked loop of claim 14, wherein the frequency of the output frequency signal is adjusted depending on a value of the first digital input signal.

17. The phase locked loop of claim 14, wherein the divider receives a second digital input signal from the external device, and adjusts a division ratio, at which the frequency of the output frequency signal is divided to a frequency of the division frequency signal, based on the second digital input signal.

18. A phase locked loop, comprising:
a phase detector configured to receive a reference frequency signal and a division frequency signal and to output a first signal corresponding to a phase difference of the reference frequency signal and the division frequency signal;
a charge pump configured to receive the first signal and to amplify the first signal to output a second signal;
a loop filter configured to receive the second signal and to filter the second signal to output a third signal;
a voltage-to-current converter configured to receive the third signal and to convert and output the third signal into a fourth signal;
a digital-to-analog converter configured to receive the fourth signal and a digital compensation signal and to output a fifth signal based on the fourth signal and the digital compensation signal;
an oscillator configured to receive the fifth signal and to output an output frequency signal having a frequency corresponding to the fifth signal;
a divider configured to receive the output frequency signal, to receive a first digital input signal from an external device, and to divide a frequency of the output frequency signal to a frequency of the division frequency signal at a division ratio defined by the first digital input signal to thus output the division frequency signal and a compensation frequency signal;
an automatic frequency calibrator configured to receive the compensation frequency signal and the reference frequency signal and to compensate for the voltage-to-current converter based on a difference between a frequency of the compensation frequency signal and a frequency of the reference frequency signal;
an adder configured to receive a second digital input signal from the external device, to receive a digital gain control signal from the automatic frequency calibrator, and to output, as the digital compensation signal, a sum of the first digital input signal and the digital gain control signal; and
a reset circuit configured to reset the divider and the phase detector in response to which a settling operation is performed in which the division ratio is adjusted by the first digital input signal and the frequency of the output frequency signal is adjusted by the second digital input signal.

19. The phase locked loop of claim 18, wherein, after the settling operation is completed, the reset circuit releases the reset of the divider and the phase detector in synchronization with the reference frequency signal.

20. An operating method of a phase locked loop which includes a phase detector, a charge pump, a loop filter, a voltage-to-current converter, a digital-to-analog converter, an oscillator, and a divider, the operating method comprising:
turning on all converting transistors of the digital-to-analog converter;

dividing, at the divider, a frequency of an output frequency signal of the oscillator to generate a compensation frequency signal;

comparing a frequency of a reference frequency signal and a frequency of the compensation frequency signal; and calibrating an amount of output current of the voltage-to-current converter, depending on a result of the comparing.

\* \* \* \* \*